United States Patent [19]
Hughes

[11] Patent Number: 5,369,406
[45] Date of Patent: Nov. 29, 1994

[54] MULTIPLYING DIGITAL-TO-ANALOGUE CONVERTER

[75] Inventor: John B. Hughes, Hove, England

[73] Assignee: U.S. Philips Corporation, New York, N.Y.

[21] Appl. No.: 966,205

[22] Filed: Oct. 26, 1992

[30] Foreign Application Priority Data

Nov. 6, 1991 [GB] United Kingdom ............... 9123560

[51] Int. Cl.$^5$ ............................................ H03M 1/66
[52] U.S. Cl. ............................................ 341/135; 341/144
[58] Field of Search ............... 341/118, 127, 135, 144, 341/154

[56] References Cited

U.S. PATENT DOCUMENTS

| | | | |
|---|---|---|---|
| 4,595,912 | 6/1986 | Hoehn | 341/135 |
| 4,631,522 | 12/1986 | Cabot | 341/118 |
| 4,914,440 | 4/1990 | Ramet | 341/140 |
| 4,931,795 | 6/1990 | Gord | 341/135 |

FOREIGN PATENT DOCUMENTS 60-24130  7/1985  Japan .
60-130220 7/1985  Japan .
61-2427   1/1986  Japan .

OTHER PUBLICATIONS

IBM Technical Disclosure Bulletin, vol. 24, No. 5, (Oct. 1981) T. G. Cole and C. Smith, pp. 2342–2344.

Primary Examiner—Marc S. Hoff
Attorney, Agent, or Firm—Bernard Franzblau

[57] ABSTRACT

A multiplying digital-to-analogue converter of the kind in which digitally weighted currents proportional to a voltage applied to an analogue input are generated at respective outputs of a current mirror arrangement. These currents are switched to an output in accordance with the value of a digital signal applied to a digital input. In order for the converter to accommodate an analogue input voltage of either polarity relative to ground and generate corresponding output currents, a bias current is applied to the current mirror input from a current source. This results in digitally weighted bias currents being generated at the current mirror outputs. These bias currents are offset by corresponding bias currents generated at respective outputs of a second current mirror arrangement.

5 Claims, 2 Drawing Sheets

MULTIPLYING DIGITAL-TO-ANALOGUE CONVERTER

BACKGROUND OF THE INVENTION

This invention relates to a multiplying digital-to-analogue converter circuit arrangement comprising a current mirror arrangement constructed to generate currents $-2^{-1}I_1, -2^{-2}I_1, \ldots, -2^{-n}I_1$ at first, second, ... nth outputs respectively thereof in response to the application of a current $J_1$ to an input thereof, where $I_1$ is in a predetermined ratio to $J_1$, and a respective controllable switch coupling each said output to an output of the converter circuit arrangement, control inputs of said switches collectively constituting the digital signal input of said converter circuit arrangement.

Known such converter circuit arrangements are disclosed in, for example, IBM Technical Disclosure Bulletin Vol. 24, No. 5, (October 1981) at pages 2342-2344, and in JP-A-61-2427. Each of these known converter arrangements generates a current at its output when a current is applied to the current mirror input and at least one of the switches is closed, the output current being proportional to both the mirror input current and the number represented by the digital code constituted by the configuration of closed and open switches prevailing at the relevant time. The input currents to the current mirror arrangements of these known converters must always have a specific polarity if the mirror arrangements are to operate correctly, and it will be evident moreover that the output currents of these known converters always have a specific polarity too, whatever the value of the mirror input current and/or the configuration of open and closed switches actually is.

In some possible applications for multiplying digital-to-analogue converts there is a requirement that the converter be capable of operating with analogue input signal currents of either polarity and generating output currents having polarity which is governed by that of the input signal current regardless of what the particular value of the converter digital input signal is at the relevant time. If an analogue signal. current input is coupled to an input of the current mirror arrangement of either of the known converter arrangements and, moreover, a forward bias current is applied to an input of the relevant current mirror arrangement, then the current mirror arrangement can be made to operate with analogue input signal currents of either polarity. However, the converter output current will still always have the same polarity, regardless of the polarity of the input signal current. Addition of a fixed opposing bias current to the converter output current will not solve this problem because, although it makes possible the production of resulting output currents of either polarity, these polarities can only be correctly governed by those of the input signal current for one specific value of the converter digital input signal.

In order to provide a solution to this problem in the case of generalized multiplying digital-to-analogue converters JP-A-60-241307 discloses a converter arrangement which includes two mutually identical complete multiplying digital-to-analogue converters. Both converters are fed with the same digital input signal at all times, i.e. their digital signal inputs are connected in parallel. The analogue input of the first converter is fed with both an analogue input signal current and a bias current as postulated above, whereas the analogne input of the second converter is fed only with a bias current which is identical to that fed to the analogne input of the first converter. The analogue output current of the second converter is sign-reversed and the result is added as a bias to the analogue output current of the first converter. Thus the biassing of the output current of the first converter is adjusted in accordance with the value of the digital input signal to the arrangement in such a way that the resulting output current (which constitutes the arrangement output) always has the correct sign relationship to the sign of the analogue input signal current to the arrangement. The effect on the output current of the first converter of the biassing of its input current is always exactly cancelled by the addition thereto of the sign-reversed output current of the second converter, regardless of the value of the digital input signal of the arrangement.

The use of two complete multiplying digital-to-analogue converters in the arrangement of JP-A-60-241307 can be rather costly, and it is an object of the present invention to provide an arrangement which can give equivalent results with less complex circuitry.

SUMMARY OF THE INVENTION

The invention provides a multiplying digital-to-analogue converter circuit arrangement of the kind defined in the first paragraph which is characterized in that it includes a second current mirror arrangement constructed to generate currents $2^{-1}I_2, 2^{-2}I_2, \ldots, 2^{-n}I_2$ at first, second, ... nth outputs, respectively, thereof in response to the application of a current $-J_2$ to an input thereof, where $I_2$ is in a predetermined ratio to $J_2$, d.c. connections between the first, second, ... nth outputs of said second current mirror arrangement and the first, second, ... nth outputs respectively of the first-mentioned current mirror arrangement. A direct current source is connected to the input of said first-mentioned current mirror arrangement for applying a bias current $J_1$ thereto, and a direct current source connected to the input of said second current mirror arrangement for applying a bias current thereto which will result in the generation of currents $2^{-1}I_1, 2^{-2}I_1, \ldots, 2^{-n}I_1$ at the first, second, ... nth outputs respectively of said second current mirror arrangement, and an analogue signal current input is connected to the input of said first-mentioned current mirror arrangement. It should be noted that the presence of minus signs in front of some of the currents referred to and not in front of others is to be understood to denote merely the relative polarities of the various currents and not their absolute polarities, the latter being dependent at will on whatever sign is chosen to be appropriate to denote, for example, the flow of conventional current into (as compared with out of) a node.

BRIEF DESCRIPTION OF THE DRAWINGS

Embodiments of the invention will now be described, by way of example, with reference to the accompanying diagrammatic drawings, in which.

DESCRIPTION OF THE PREFERRED EMBODIMENTS

Figure 1:
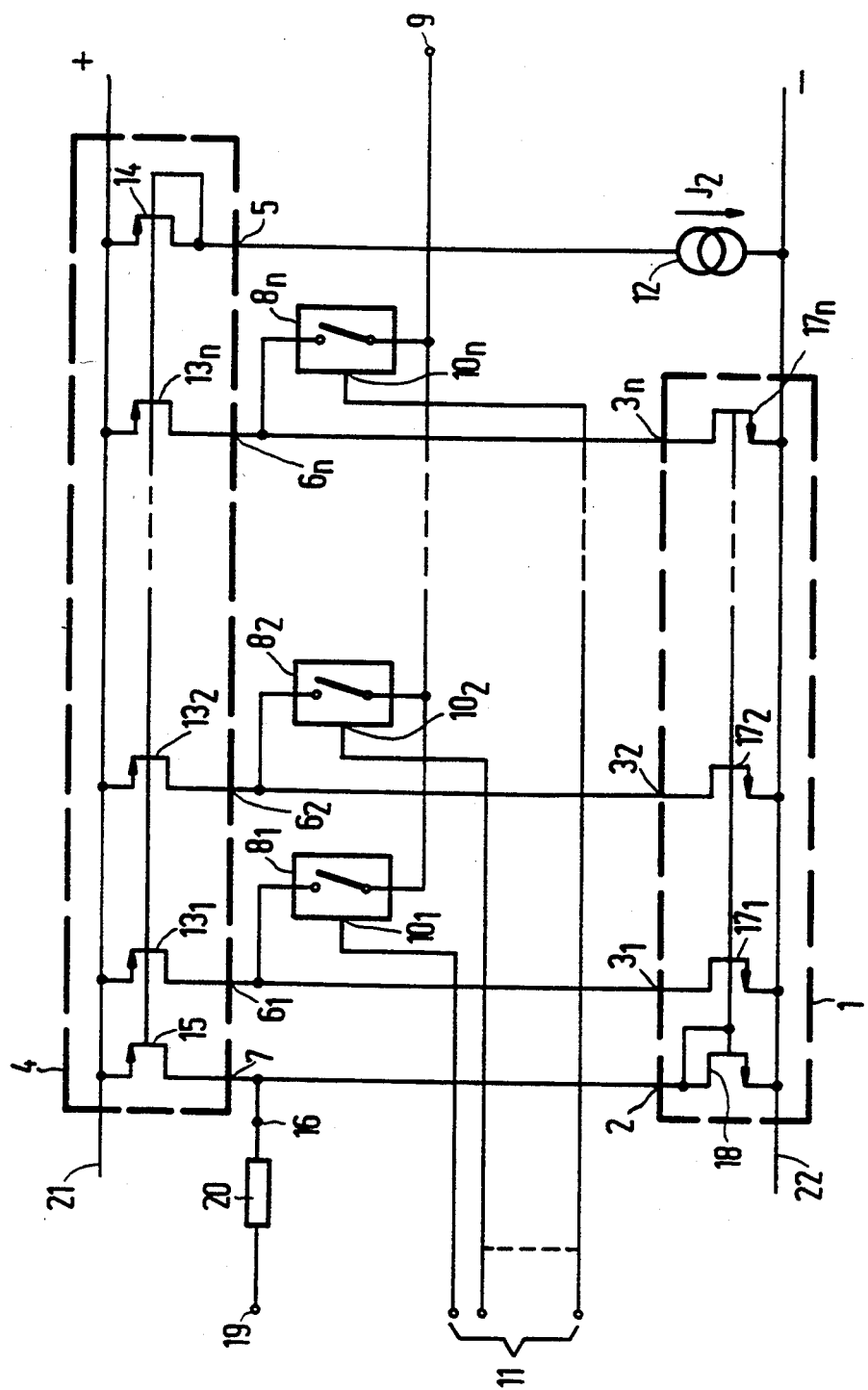
FIG. 1 is the circuit diagram of a simple first embodiment.

In FIG. 1, a multiplying digital-to-analogue converter circuit arrangement comprises a first current mirror arrangement 1 having an input 2 and n outputs $3_1, 3_2, \ldots 3_n$, a second current mirror arrangement 4 having an input 5, n outputs $6_1, 6_2, \ldots 6_n$ and a further output 7, and n controllable switches $8_1, 8_2, \ldots 8_n$ which couple the outputs $3_1, 3_2, \ldots 3_n$ respectively of the mirror 1 to the output 9 of the converter arrangement. The switches $8_1, 8_2, \ldots 8_n$ (which may be constituted by transistor switches) have control inputs $10_1, 10_2, \ldots 10_n$ respectively which collectively constitute the digital signal input 11 of the converter arrangement. The outputs $3_1, 3_2, \ldots 3_n$ of the mirror arrangement 1 are d.c.-connected to the outputs $6_1, 6_2, \ldots 6_n$ respectively of the mirror arrangement 4, and the further output 7 of the mirror arrangement 4 is d.c.-connected to the input 2 of the mirror arrangement 1. The input 5 of the mirror arrangement 4 is fed with a current $-J_2$ by means of a direct current source 12 connected thereto. This results in currents $2^{-1}I_2, 2^{-2}I_2, \ldots, 2^{-n}I_2$ being generated at the outputs $6_1, 6_2, \ldots 6_n$ respectively of the mirror arrangement 4, and in a current $J_1$ being generated at the further output 7, where $I_2$ is in a predetermined ratio $R_1$ to $J_2$, and $J_1$ is in a predetermined ratio $R_2$ to $J_2$. ($R_1$ and $R_2$ may or may not be equal to each other). To this end the sizes of the transistors $13_1, 13_2, \ldots 13_n$ whose drains feed the outputs $6_1, 6_2, \ldots 6_n$ respectively are chosen in known manner to be in the ratios $2^{-1}R_1, 2^{-2}R_1, \ldots, 2^{-n}R_1$ respectively to the size of the diode-connected transistor 14 which is fed from the input 5, and the size of the transistor 15 which feeds the output 7 is chosen to be in the ratio $R_2$ to the size of the transistor 14.

The output 7 of mirror arrangement 4 is used as a direct current source for supplying the input 2 of mirror arrangement 1 with a bias current $J_1$. Mirror arrangement 1 responds to the bias current $J_1$ by generating currents $-2^{-1}I_1, -2^{-2}I_1, \ldots, -2^{-n}I_1$ at its outputs $3_1, 3_2, \ldots 3_n$ respectively, where $I_1$ is in a predetermined ratio $R_3$ to $J_1$. ($R_3$ may or may not be equal to $R_1$ and/or $R_2$). To this end the sizes of the transistors $17_1, 17_2, \ldots 17_n$ whose drains feed the outputs $3_1, 3_2, \ldots 3_n$ respectively are chosen in known manner to be in the ratios $2^{-1}R_3, 2^{-2}R_3, \ldots 2^{-n}R_3$ to the size of the diode-connected transistor 18 which is fed from the input 2. It is arranged moreover that under the conditions at present being described, i.e. with no current i passing to or from the input 2 of mirror arrangement 1 via a signal current input terminal 16, the currents generated at the outputs $6_1, 6_2, \ldots 6_n$ of mirror circuit 4 are exactly matched by those sunk at the outputs $3_1, 3_2, \ldots 3_n$ respectively of mirror circuit 1, so that no current will be transferred to the output 9 of the converter arrangement in the event that any of the switches 8 are closed. Thus it is arranged that $I_2 = I_1$, which implies that $R_2 \cdot R_3 = R_1$. The relative sizes of the transistors 13, 15, 17 and 18 are therefore chosen so that this last condition is satisfied.

If now a positive signal current i is applied to the signal current input 16 from a signal voltage input 19 via a high-value resistor 20 the current fed to the input 2 of mirror arrangement 1 will increase, resulting in mirror 1 attempting to increase the currents sunk at each of its outputs 3. Now if any of the switches 8 are closed this will result in current being drawn to the relevant output(s) 3 from the output terminal 9. If, on the other hand, the signal current is negative the opposite effect will occur; the excess of the currents generated at the relevant outputs 6 of mirror 4 over that now being sunk by the relevant outputs 3 of mirror arrangement 1 will pass to output 9 via any closed switch 8.

The input voltage applied to input 19 should obviously be referred to a voltage level lying midway between the potentials on the positive and negative supply rails 21 and 22 respectively, and the converter output current at terminal 9 should also be sunk/sourced at this voltage level. The latter can be conveniently achieved by connecting the terminal 9 to the so-called "virtual ground" inverting input of an operational amplifier provided with a feedback path from its output to its inverting input, this amplifier having its power supply input connected between the supply rails 21 and 22.

Figure 2:
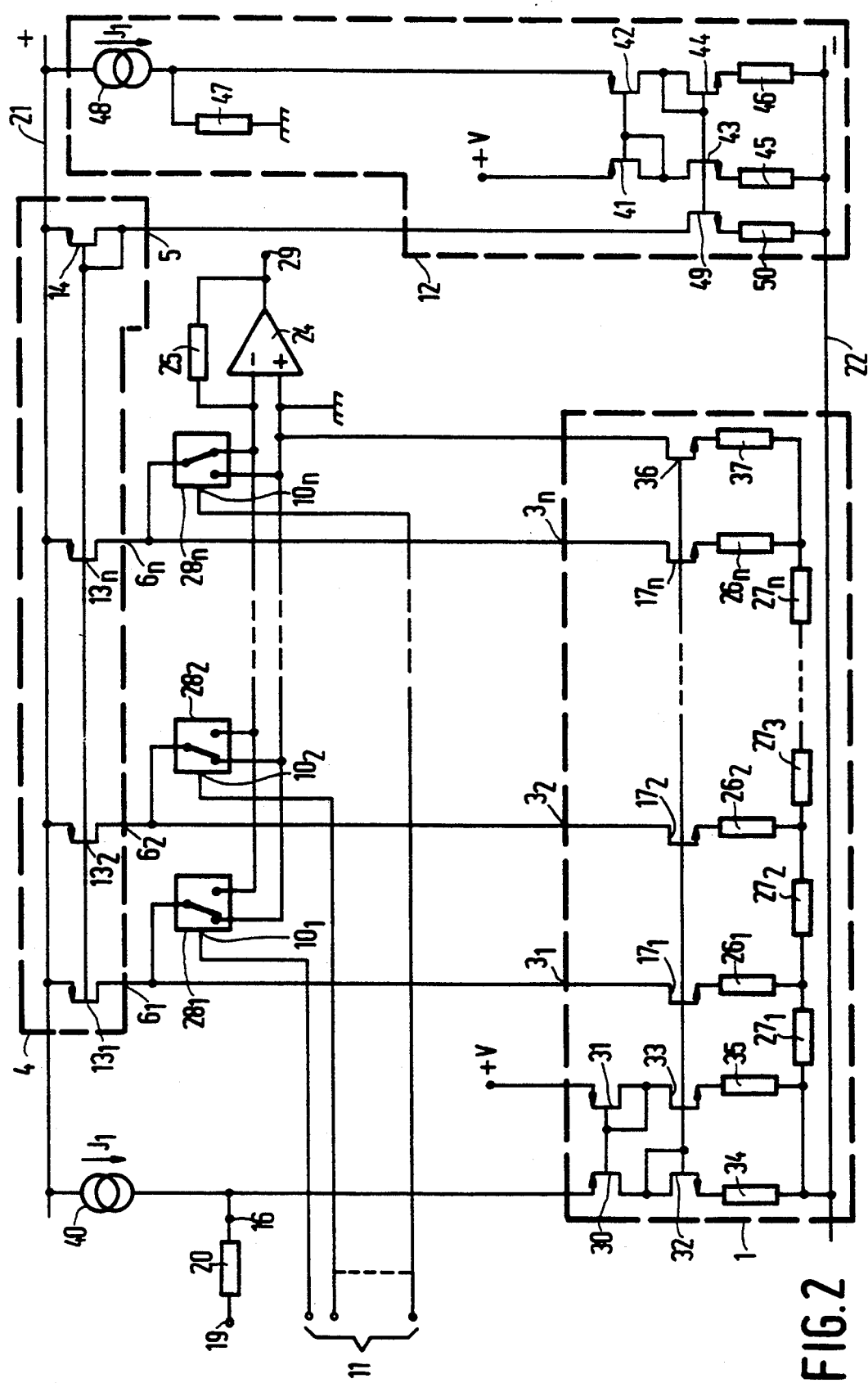
FIG. 2 is the circuit diagram of a second embodiment which includes various refinements compared with that of FIG. 1.

In the embodiment of FIG. 2 various components have been given, where appropriate, the same references as their counterparts in FIG. 1.

One way in which the embodiment of FIG. 2 differs from that of FIG. 1 is that the current mirror 1 employs in known manner a group of interconnected transistors 30, 31, 32 and 33 instead of the simple diode-connected transistor 18 of FIG. 1, to obtain improved accuracy. Accuracy is still further improved by providing the transistors $17_1$–$17_n$ with resistors $26_1$–$26_n$ respectively in their source lines, providing the transistors 32 and 33 likewise with source resistors 34 and 35 respectively, providing a further transistor 36 having a source resistor 37 in such manner that the series combination of its gate, source and source resistor is connected in parallel with the series combination of the gate, source and source resistor of transistor $17_n$ and its drain is connected to ground (a potential midway between the potentials on the supply lines 21 and 22) and providing a chain of series-connected resistors $27_1$–$27_n$ between the negative supply rail 22 and the common point of the source resistors $26_n$, 37, the ends of the source resistors $26_1$–$26_{n-1}$ which are remote from the source of the corresponding transistor 17 being connected to respective junctions between successive resistors of the chain $27_1$–$27_n$. The transistor 36 is identical to the transistor $17_n$, and the transistors 30–33 are each twice the size of the transistor $17_1$ (the latter meaning that the ratio $R_3$ is unity in the embodiment of FIG. 2). Provision of the transistor 36, the source resistors $26_1$–$26_n$, 34, 35 and 37, and the chain of resistors $27_1$–$27_n$ results in source degeneration, thereby improving the ratio matching of the binary weighted currents at the mirror outputs $3_1$–$3_n$ and also signal gain accuracy and noise performance.

Another way in which the embodiment of FIG. 2 differs from that of FIG. 1 is that it employs changeover switches $28_1$–$28_n$ (which may be constituted by switching transistors) instead of simple switches 8. The various common points of the outputs 3 of current mirror 1 and the outputs 6 of current mirror 4 are individually switchable by means of these switches between the inverting input of an operational amplifier 24 and ground in accordance with the digital signal applied to input 11. Amplifier 24, the output 29 of which constitutes the output of the converter, is provided with a negative feedback resistor 25 so that its inverting input (corresponding to the output 9 of FIG. 1) constitutes a virtual ground. Thus each of the said common points is effectively returned to ground whatever the actual switching state of the corresponding switch 28. The reason for this is that, if the arrangement of resistors $26_1$–$26_n$, $27_1$–$27_n$ previously discussed is to operate correctly, the transistors $26_1$–$26_n$ should have substantially equal source potentials. This implies that the transistors $26_1$–$26_n$ must always be in the saturated state, and this is ensured by arranging that the drains of these transistors are effectively connected to ground (midway between the potentials on the supply rails 21 and 22) whatever the actual switching state of the corresponding switch 28.

It will be noted that the source of transistor 31 is not connected to ground as would be expected in view of the fact that the input signal voltage applied to terminal 19 is referred to ground, but is shown connected to a potential $+V$. The effect of this is to make the voltage at input terminal 16 also $+V$ so that, if the input voltage applied to terminal 19 is zero (relative to ground), a current I flows from terminal 16 to ground via resistor 20, where $I=V/R$, R being the resistance of resistor 20. The input current to current mirror 1 under these conditions, i.e. the input bias current to mirror 1, is therefore $J_1-I$, where $J_1$ is the output current of a current source 40 which takes the place of the transistor 15 of FIG. 1. The advantage of this is that, for a given supply voltage between the rails 21 and 22, the output current $J_1$ of current source 40 can be increased over the maximum which would otherwise be permissible, permitting a larger input voltage swing at input terminal 19 than could otherwise be accommodated.

Obviously the reduction of bias current applied to the input of current mirror 1 entails a corresponding reduction in the bias currents generated at its outputs $3_1$–$3_n$, making necessary corresponding reductions in the bias currents generated at the outputs $6_1$–$6_n$ of current mirror 4. The last-mentioned reduction could, of course, be achieved by suitably adjusting the size of transistor 14 relative to the sizes of the transistors $13_1$–$13_n$ but, in the interests of symmetry, it is achieved in the embodiment of FIG. 2 by arranging that the input 5 of current mirror 4 is supplied with bias current by means of a current source which for the most part is identical to the arrangement of transistors 30–33, resistors 20,34 and 35, and current source 40 associated with the current mirror 1. Thus the current source 12 which feeds the input 5 of mirror 4 (c.f. FIG. 1) comprises an arrangement of transistors 41–44, resistors 45–47 and a current source 48 which corresponds exactly to the arrangement of transistors 30–33 resistors 34,35 and 20 and current source 40, both in respect of circuit configuration and identity of circuit components, with the exception that resistor 47 is connected to ground rather than to a voltage input terminal. Current source 12 also includes a further transistor 49 provided with an emitter resistor 50, identical to transistor 43 and resistor 45 respectively, the series combination of the gate-source path of transistor 49 and resistor 50 being connected in parallel with the series combination of the gate-source path of transistor 43 and resistor 45, and the drain of transistor 49 being connected to the input 5 of mirror 4. The input 5 is therefore supplied with a current $-(J_1-I)$, thereby ensuring that the bias currents generated at the outputs $6_1$–$6_n$ of mirror 4 have the required values if, as is the case, the sizes of the transistors $13_1, 13_2, \ldots 13_n$ are chosen to be in the ratios $2^{-1}, 2^{-2}, \ldots 2^{-n}$ respectively to the size of the diode-connected transistor 14, i.e. provided that $R_1$ (c.f. the description with reference to FIG. 1) is chosen to be equal to unity.

It will be evident that, if desired, the transistors $13_1 \ldots 13_n$ of FIG. 2 may be provided with a resistor ladder network in their source circuits similar to the network $26_1$–$26_n$, $27_1$–$27_n$ provided in the source circuits of the transistors $17_1$–$17_n$, to improve the ratio matching of the binary weighted currents at the outputs $6_1$–$6_n$. If the arrangement is made symmetrical in this way then it can be made to operate satisfactorily with a balanced analogue input signal by the simple expedient of connecting resistor 47 to an antiphase input voltage terminal rather than to ground.

It will also be evident that many modifications may be made to the embodiments described within the scope of the invention as defined by the claims. For example, many alternative circuit arrangements are possible with respect to the current mirror arrangements, e.g. those employing cascoded transistors and/or bipolar transistors.

From reading the present disclosure, other modifications will be apparent to persons skilled in the art. Such modifications may involve other features which are already known in the design, manufacture and use of digital-to-analogue converters and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

I claim:

1. A multiplying digital-to-analogue converter circuit arrangement comprising:

a first current mirror arrangement constructed to generate currents $-2^{-1}I_1, -2^{-2}I_1, \ldots, -2^{-n}I_1$ at first second, ... nth outputs respectively thereof in response to the application of a current $J_1$ to an input thereof, where $I_1$ is in a predetermined ratio to $J_1$, a respective controllable switch coupling each said output to an output of the converter circuit arrangement, control inputs of said switches collectively constituting the digital signal input of said converter circuit arrangement, wherein the converter circuit arrangement includes a second current mirror arrangement constructed to generate currents $2^{-1}I_2, 2^{-2}I_2, \ldots, 2^{-n}I_2$ at first, second, ... nth outputs respectively thereof in response to the application of a current $-J_2$ to an input thereof, where $I_2$ is in a predetermined ratio to $J_2$, d.c. connections between the first, second, ... nth outputs of said second current mirror arrangement and the first, second, ... nth outputs, respectively, of the first current mirror arrangement, a direct current source connected to the input of said first current mirror arrangement for applying a bias current $J_1$ thereto, a direct current source connected to the input of said second current mirror arrangement for applying a bias current thereto which will result in the generation of currents $2^{-1}I_1, 2^{-2}I_1, \ldots, 2^{-n}I_1$ at the first, second, ... nth outputs, respectively, of said second current mirror arrangement, and an analogue signal current input connected to the input of said first current mirror arrangement.

2. An arrangement as claimed in claim 1, wherein said first current mirror arrangement includes a respective transistor corresponding to each output thereof and also a further transistor, each said transistor having an input electrode, an output electrode and a common electrode, the input electrodes of all said transistors being commoned, the output electrode of each said respective transistor being connected to the corresponding output of said first current mirror arrangement, the common electrodes of said respective transistors corresponding to the first, second, . . . nth outputs of said first current mirror arrangement being connected via respective resistance of value 2R to successive points on a chain of n resistances of value R followed by a resistance of value 2R, which chain extends from a first reference potential point to the common electrode of said further transistor, and the output electrode of said further transistor being connected to a second reference potential point.

3. An arrangement as claimed in claim 2, wherein each said controllable switch comprises a changeover switch arranged to alternatively couple the corresponding output of the first current mirror arrangement to the output of the converter circuit arrangement and to a reference potential point.

4. An arrangement as claimed in claim 1 further comprising a d.c. connection between a further output of the second current mirror arrangement and said input of the first current mirror arrangement and which functions as said direct current source applying said bias current $J_1$ to said input of the first current mirror arrangement.

5. An arrangement as claimed in claim 1 wherein each controllable switch comprises a changeover switch arranged to alternatively couple the corresponding output of the first current mirror arrangement to the output of the converter circuit arrangement and to a reference potential point.

* * * * *